United States Patent [19]
Spring et al.

[11] Patent Number: 5,859,465
[45] Date of Patent: Jan. 12, 1999

[54] HIGH VOLTAGE POWER SCHOTTKY WITH ALUMINUM BARRIER METAL SPACED FROM FIRST DIFFUSED RING

[75] Inventors: Kyle A. Spring, Thousand Oaks, Calif.; Perry L. Merrill, Globe, Ariz.

[73] Assignee: International Rectifier Corporation, El Segundo, Calif.

[21] Appl. No.: 729,873

[22] Filed: Oct. 15, 1996

[51] Int. Cl.[6] .................... H01L 27/095; H01L 29/47; H01L 29/812
[52] U.S. Cl. .................... 257/484; 257/481; 257/485
[58] Field of Search .................... 257/471, 475, 257/476, 481, 482, 483, 484, 485, 486

[56] References Cited

U.S. PATENT DOCUMENTS

| | | |
|---|---|---|
| 3,586,542 | 6/1971 | MacRae . |
| 3,599,054 | 8/1971 | Lepselter et al. . |
| 3,694,719 | 9/1972 | Saxena . |
| 3,783,049 | 1/1974 | Sandera . |
| 3,855,612 | 12/1974 | Rosvold . |
| 3,953,243 | 4/1976 | Goetzberger et al. . |
| 4,063,964 | 12/1977 | Peressini et al. . |
| 4,253,105 | 2/1981 | Olmstead et al. . |
| 4,370,670 | 1/1983 | Nawata et al. . |
| 4,373,166 | 2/1983 | Bergeron et al. . |
| 4,405,934 | 9/1983 | Sloan . |
| 4,536,945 | 8/1985 | Gray et al. . |
| 4,594,602 | 6/1986 | Iimura et al. . |
| 4,607,270 | 8/1986 | Jesaka . |
| 4,618,871 | 10/1986 | Mitlehner . |
| 4,641,174 | 2/1987 | Baliga . |
| 4,646,115 | 2/1987 | Shannon et al. . |
| 4,691,223 | 9/1987 | Murakami et al. . |
| 4,899,199 | 2/1990 | Gould . |
| 4,901,120 | 2/1990 | Weaver et al. . |
| 5,148,240 | 9/1992 | Ohtsuka et al. . |
| 5,158,909 | 10/1992 | Ohtsuka . |
| 5,418,185 | 5/1995 | Todd et al. . |
| 5,539,237 | 7/1996 | Todd et al. . |

FOREIGN PATENT DOCUMENTS 0129362 of 1984 European Pat. Off. .

OTHER PUBLICATIONS

"Characteristics of Aluminum–Silicon Schottky Barrier Diode"; Solid–State Electronics, Pergamon Press, 1970, vol. 13, pp. 97–104 (Gr. Britain); A.Y.C. Yu and C.A. Mead.

"High–Speed Low–Loss p–n Diode Having a Channel Structure"; IEEE Transactions on Electron Devices, vol. ED–31, No. 9, Sep. 1994; Shimizu, et al.

"Novel Low–Loss and High–Speed Diode Utilizing an 'Ideal' Ohmic Contact"; IEEE Transactions on Electron Devices; vol. ED–29, No. 2; 2/1982; Amemiya, et al.

"Multiemitter Schottky Barrier Transistor with Negligible Emitter–To–Emitter Gain"; IBM Technical Disclosure Bulletin; vol. 14, No. 4; 9/1971; G. Zeidenbergs.

"Power Transistor with Reduced Minority Carrier Storage"; IBM Technical Disclosure Bulletin;. vol. 19, No. 10; 3/1977; R.M. Bill and S.P. Gaur.

"The Pinch Rectifier: A Low–Forward–Drop High–Speed Power Diode"; IEEE Electron Device Letters; vol. EDL–5, No. 6; Jun. 1984; B. J. Baliga.

"Schottky Rectifiers for Low–Voltage Outputs"; Unitrode Corporation; P.L. Hower and C.E. Weaver.

Patent Abstracts of Japan, vol. 9, No. 136 (E–320), 12 Jun. 1985 & JP 60 020585 A (Sanyo Denki KK), 1 Feb. 1985.

"Schottky Barrier Diode with Isolated Guard Ring", IBM Technicla Disclosure Bulletin, vol. 20, No. 8, Jan. 1978, New York, US, pp. 3197–3198, XP002062843.

Patent Abstracts of Japan, vol. 6, No. 28 (E–095), 19 Feb. 1982 & JP 56 148871 A (NEC Corp.), 18 Nov. 1981.

*Primary Examiner*—Ngân V. Ngô
*Attorney, Agent, or Firm*—Ostrolenk, Faber, Gerb & Soffen, LLP

[57] ABSTRACT

A vertical conduction Schottky device having a reverse voltage rating in excess of 400 volts uses an aluminum barrier metal in contact with an $N^-$ epitaxial silicon surface. A diffused $P^+$ guard ring surrounds the barrier metal contact and is spaced therefrom by a small gap which is fully depleted at a low reverse voltage to connect the ring to the barrier contact under reverse voltage conditions. Lifetime killing is used for the body of the diode.

17 Claims, 1 Drawing Sheet

HIGH VOLTAGE POWER SCHOTTKY WITH ALUMINUM BARRIER METAL SPACED FROM FIRST DIFFUSED RING

FIELD OF THE INVENTION

This invention relates to Schottky diodes, and more specifically relates to a high voltage Schottky diode with high speed turn off.

BACKGROUND OF THE INVENTION

Schottky diodes are very well known and normally employ a high work function material which is in contact with an epitaxially grown N silicon surface. The Schottky diode has the advantage over a P/N junction diode of very high speed reverse recovery, permitting their use in very high frequency applications. Higher voltage prior art Schottky diodes frequently employ a $P^+$ guard ring diffusion which encloses and contacts the contact metal. Such prior art devices, and a process for their manufacture, are typically shown in U.S. Pat. No. 4,899,199 to Herbert Gould. The guard ring, at lower voltage, causes low leakage current and a very sharp avalanche breakdown characteristic.

Presently known Schottky diodes are usually rated at less than about 200 volts. However, as the reverse voltage increases, a higher resistivity epitaxial silicon is needed. Thus, the forward current can cause a resistive voltage drop in the epitaxial silicon higher than a diode drop (about 0.7 volts). This then causes the $N^-/P^+$ junction to be forward biased to inject minority carriers during forward conduction. The main advantage of high speed turn-off is then lost.

BRIEF SUMMARY OF THE INVENTION

The present invention provides a novel Schottky diode which has a voltage rating in excess of about 400 volts while still retaining the high speed operation and sharp avalanche voltage characteristics of lower voltage Schottkys.

In accordance with the present invention, the first $P^+$ guard ring is intentionally spaced from the contact metal by a short gap in the $N^-$ epitaxial silicon surface which can fully deplete at low voltage during reverse bias. Consequently, the floating $P^+$ ring will not inject minority carriers during forward current conduction and, during reverse bias, it is quickly connected, through the depletion regions, to the contact metal to act as a guard ring to spread the electric field at the device periphery.

In accordance with a further feature of the invention, the Schottky metal is selected to be aluminum. While aluminum is not the high work function metal normally selected for Schottky diodes (usually molybdenum, tungsten, platinum, palladium or the like), it has been found that aluminum works well for the high voltage (above about 400 volts) Schottky diode and it simplifies its manufacture.

As a still further feature of the invention, lifetime killing is employed for the body of the silicon chip. The lifetime killer can be a heavy metal diffusion, for example, gold, or can be carried out by a suitable radiation treatment.

As a still further feature of the invention, a spreading resistance layer connecting the anode and cathode regions may be employed to provide a more consistent and reliable reverse voltage performance. The spreading resistor may, for example, be any suitable high resistivity material such as amorphous silicon (~1800Å).

It should be noted that a spaced $P^+$ guard ring is shown in U.S. Pat. No. 5,418,185. That device, however, is a lateral conduction device built on a P type substrate. The guard ring of that patent is employed to reduce the effect of a PNP parasitic transistor formed by the $P^+$ guard ring, the N type epitaxial silicon and the P type substrate. By contrast, the present invention is a vertical conduction device without a P type body structure.

Other features and advantages of the present invention will become apparent from the following description of the invention which refers to the accompanying drawings.

DETAILED DESCRIPTION OF THE DRAWINGS

Figure 1:
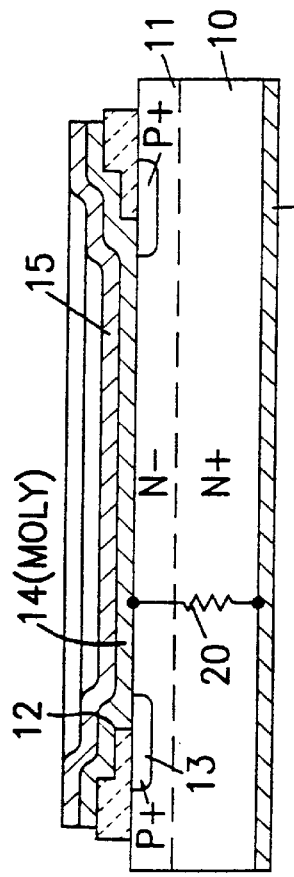
FIG. 1 shows a cross-section of a prior art Schottky diode with a $P^+$ guard ring.

Referring first to FIG. 1, there is shown a prior art Schottky diode chip, in cross-section. The topology may have any desired shape and, for example, can be a square chip or the like. The device or chip shown is similar to that of U.S. Pat. No. 4,899,199 and consists of a thin $N^+$ body 10 of monocrystalline silicon. A thin layer of $N^-$ silicon 11 is epitaxially grown atop the $N^+$ body 10.

Using conventional photolithography processing, an oxide layer is grown atop the $N^-$ layer 11 and an annular window, one border 12 of which remains, is opened and a $P^+$ guard ring 13 is diffused into the $N^-$ layer 11. The oxide layer overlying the $N^-$ silicon area and part of the $P^+$ ring is then removed. A molybdenum Schottky contact metal 14 is then deposited over the exposed $N^-$ surface and the inner portion of $P^+$ ring 13. This contact is, in turn, covered by a contact material 15, enabling easy connection to the molybdenum 14 and acting as a seal to hold the molybdenum to the oxide. A bottom contact 16 is conventionally connected to the bottom surface of $N^+$ region 10 to complete the device.

The device of FIG. 1 is conventionally employed for Schottky diodes having a reverse voltage capability of up to about 200 volts.

These devices have a low reverse leakage current under reverse bias and have a sharp breakdown voltage characteristic. They are also extremely fast, enabling their use at high frequency.

However, as the reverse voltage rating of the device is increased, the resistivity of region 11 must increase. Thus, the forward current through this increased resistance 20 can cause the voltage drop across the effective resistance 20 of the device to increase to above a diode drop (about 0.7 volts). When this occurs, the $P^+$ region 13 will inject holes into region 11 during forward current conduction. These minority carriers then cause an increase in reverse recovery charge and a substantial increase in turn-off time, thus negating the benefits of the Schottky diode.

Figure 2:
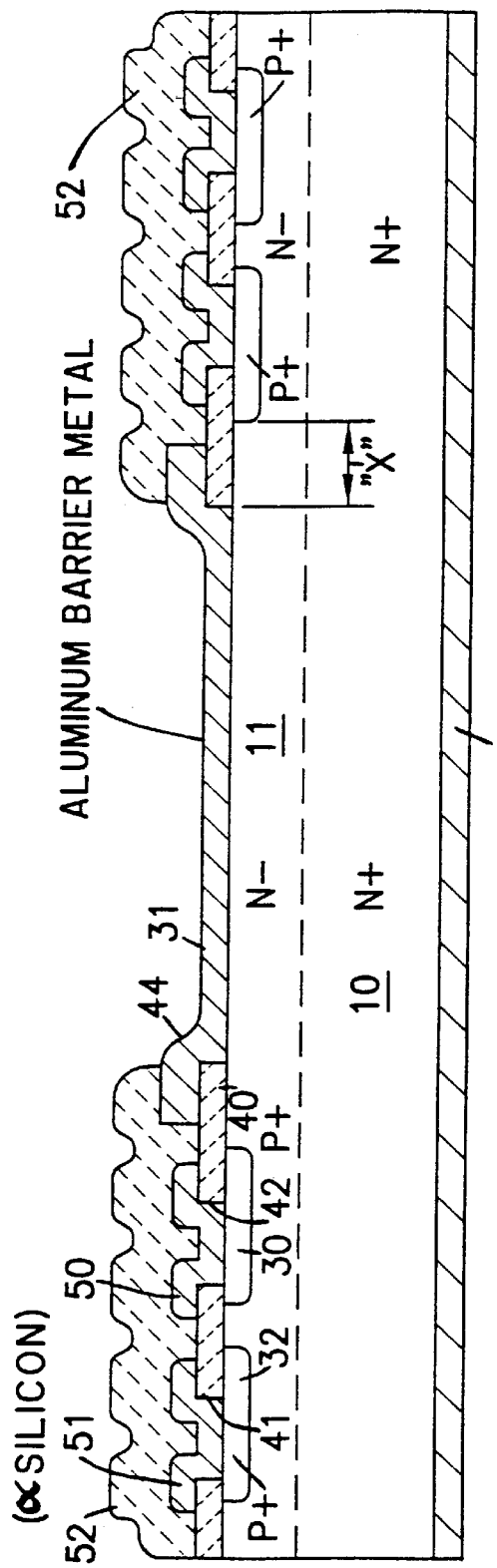
FIG. 2 is a cross-section, similar to that of FIG. 1, of a Schottky diode made in accordance with the invention.

FIG. 2 shows a cross-section of the device of the present invention in which parts similar to those of FIG. 1 have the same identifying numerals.

In accordance with an important feature of the present invention, the first $P^+$ ring 30 (corresponding to ring 13 in FIG. 1) is outwardly spaced from the outer boundary of the barrier metal contact 31 (which corresponds to contact 14 in FIG. 1). However, in accordance with a feature of the invention, barrier metal 31 is aluminum in contrast to one of the usual high work function materials normally used for a Schottky device.

The device of FIG. 2 also has a second $P^+$ ring 32 which surrounds and is spaced from the ring 30. Additional rings can be added for higher voltage devices.

To form the structure of FIG. 2, an oxide layer 40 has a plurality of ring-shaped windows 41 and 42 formed therein and the P+ rings 30 and 32, respectively, are diffused through these windows. A central window 44 is then formed in oxide 40, and an aluminum layer is then deposited atop the entire upper surface and in contact with the central N⁻ epitaxial layer 11 and the P+ rings 30 and 32. Note that the aluminum adheres well to the oxide. The aluminum is then etched to define ring-shaped contacts 50 and 51 and the central barrier contact 31.

As a critical part of the process, the first P+ ring 30 is spaced from, but is close to, the outer periphery of contact 31 at the N⁻ region. This gap is shown as gap "X" in FIG. 2, and is dimensioned to be fully depleted at a relatively low instantaneous reverse voltage. Typically, for a rated reverse voltage of about 600 volts, N⁻ region 11 will be 60 $\mu$m thick and will be 19.0 ohm-cm material. Gap "X" will be about 10 microns.

The novel structure operates at high reverse voltage, for example, above 400 volts. During forward conduction, ring 30 is not connected to contact 31 and will not inject holes, even if there is a forward voltage drop in the silicon, higher than 0.7 volts. During reverse bias, however, the gap "X" quickly depletes and ring 30 is connected to contact 31 and acts to spread the electric field at the edge of the contact 31 before the field has reached a high value. Note that the aluminum contact 31 also overlaps the oxide 40 and also acts as a field plate. The use of aluminum as the barrier metal permits simplified processing and adheres well to oxide.

As a further feature of the invention, heavy metal lifetime killing atoms, for example, gold, can be diffused with the silicon body 10. Electron irradiation may also be used.

An amorphous silicon layer 52, about 1800 Å thick, can be added as a spreading resistor to provide more reliable reverse voltage performance.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A high voltage Schottky diode comprising a chip of monocrystalline silicon having an N+ body and an N⁻ epitaxial silicon layer atop said N+ body; a Schottky barrier forming contact layer disposed atop and in contact with the upper surface of said N⁻ epitaxial silicon layer; a P+ diffusion guard ring diffused into the surface of said epitaxial layer and surrounding the periphery of said Schottky barrier forming layer; the inner periphery of said P+ diffusion guard ring being spaced from the outer periphery of said Schottky barrier forming contact layer by a lateral gap of predetermined spacing; and a second contact layer disposed on the bottom of said N+ body to define a vertical conduction device; said predetermined spacing of said lateral gap being sufficiently small such that the silicon in said gap becomes fully depleted when a reverse voltage applied between said second contact layer and said Schottky barrier forming contact reaches a value that is a small fraction of the full rated reversed voltage that can be supported by said device; wherein said upper surface of said chip has an oxide layer formed thereon; said oxide layer having a central window which exposes the surface of said N⁻ layer and having a ring-shaped window which exposes at least a portion of the surface of said P+ diffusion; said Schottky barrier forming metal contacting said N⁻ layer and said P+ diffusion through said central window and said ring shaped window, respectively, and at least partly overlapping and adhering to the edges of said oxide surrounding said central window.

2. The diode of claim 1 wherein said device has a reverse voltage rating in excess of 400 volts.

3. The diode of claim 1 wherein said Schottky barrier forming metal is aluminum.

4. The diode of claim 2 wherein said Schottky barrier forming metal is aluminum.

5. The diode of claim 1 wherein the lifetime in said N+ body is reduced.

6. The diode of claim 5 wherein said device has a reverse voltage rating in excess of 400 volts.

7. The diode of claim 5 wherein said Schottky barrier forming metal is aluminum.

8. The diode of claim 2 wherein the lifetime in said N+ body is reduced.

9. The diode of claim 1 which further includes heavy metal lifetime killing atoms distributed through said silicon.

10. The diode of claim 1 which further includes a spreading resistor overlying and connecting the anode to the cathode region.

11. The diode of claim 10 wherein said spreading resistor is an amorphous silicon layer.

12. A high voltage Schottky diode comprising a chip of monocrystalline silicon having an N+ body and an N⁻ epitaxial silicon layer atop said N+ body; a Schottky barrier forming contact layer disposed atop and in contact with the upper surface of said N⁻ epitaxial silicon layer; a P+ diffusion guard ring diffused into the surface of said epitaxial layer and surrounding the periphery of said Schottky barrier forming layer; the inner Periphery of said P+ diffusion guard ring being spaced from the outer periphery of said Schottky barrier forming contact layer by a lateral gap of predetermined spacing; a second contact layer disposed on the bottom of said N+ body to define a vertical conduction device; said predetermined spacing of said lateral gap being sufficiently small such that the silicon in said gap becomes fully depleted when a reverse voltage applied between said second contact layer and said Schottky barrier forming contact reaches a value that is a small fraction of the full rated reversed voltage that can be supported by said device; wherein said P+ diffusion guard ring is a first P+ diffusion guard ring; a second P+ guard ring diffused in the surface of said epitaxial layer and surrounding the periphery of said first guard ring, the inner periphery of said second guard ring being laterally spaced from the outer periphery of said first guard ring; and said upper surface of said chip has an oxide layer formed thereon; said oxide layer having a central window which exposes the surface of said N– layer, an inner ring-shaped window which exposes at least a portion of the surface of said first P+ diffusion and an outer ring-shaped window which exposes at least a portion of the surface of said second P+ diffusion; said Schottky barrier forming metal contacting said N– layer through said central window, said first P+ diffusion through said inner ring-shaped window and said second P+ diffusion through said outer ring-shaped window.

13. The diode of claim 12 wherein said Schottky barrier forming metal at least partly overlaps and adheres to the edges of said oxide that surrounds said central window.

14. The diode of claim 12 wherein said Schottky barrier forming contact metal is aluminum.

15. The diode of claim 12 wherein said device has a reverse voltage rating in excess of 400 volts.

16. The diode of claim 1 wherein said rated reversed voltage is about 600 volts, said N– epitaxial silicon layer has a thickness of about 60 microns and a resistivity of about 19 ohm-cm, and said predetermined spacing is about 10 microns.

17. The diode of claim 12 wherein said rated reversed voltage is about 600 volts, said N– epitaxial silicon layer has a thickness of about 60 microns and a resistivity of about 19 ohm-cm, and said predetermined spacing is about 10 microns.

* * * * *